United States Patent
Dankowski et al.

(10) Patent No.: US 11,063,000 B2
(45) Date of Patent: Jul. 13, 2021

(54) SEMICONDUCTOR PACKAGE AUTHENTICATION FEATURE

(71) Applicant: Infineon Technologies AG, Neubiberg (DE)

(72) Inventors: Stefan Dankowski, Haar-Ottendichl (DE); Tim Gutheit, Taufkirchen (DE); Bernhard Lippmann, Landshut (DE)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 16/260,912

(22) Filed: Jan. 29, 2019

(65) Prior Publication Data

US 2020/0243456 A1    Jul. 30, 2020

(51) Int. Cl.
| | |
|---|---|
| *H01L 23/544* | (2006.01) |
| *H01L 23/495* | (2006.01) |
| *H01L 23/528* | (2006.01) |
| *H01L 21/48* | (2006.01) |
| *H01L 23/31* | (2006.01) |
| *H01L 21/768* | (2006.01) |

(52) U.S. Cl.
CPC ........ *H01L 23/544* (2013.01); *H01L 21/4828* (2013.01); *H01L 21/76894* (2013.01); *H01L 23/3107* (2013.01); *H01L 23/49541* (2013.01); *H01L 23/5286* (2013.01); *H01L 2223/5442* (2013.01); *H01L 2223/54406* (2013.01); *H01L 2223/54413* (2013.01); *H01L 2223/54433* (2013.01)

(58) Field of Classification Search
CPC ............. H01L 23/544; H01L 23/49541; H01L 23/5286; H01L 21/4828; H01L 23/3107; H01L 21/76894; H01L 2223/54433; H01L 2223/54406; H01L 2223/54413; H01L 2223/5442; H01L 2224/48247; H01L 2224/48091; H01L 2224/0603; H01L 2223/54486; H01L 23/49562
See application file for complete search history.

(56) References Cited

U.S. PATENT DOCUMENTS

| | | | | |
|---|---|---|---|---|
| 4,510,673 | A * | 4/1985 | Shils | B07C 5/3412 257/E23.179 |
| 5,856,070 | A * | 1/1999 | Korth | G02B 5/1857 430/320 |
| 6,377,866 | B2 * | 4/2002 | Iwakiri | H01L 21/67282 438/401 |

(Continued)

*Primary Examiner* — Nha T Nguyen
(74) *Attorney, Agent, or Firm* — Murphy, Bilak & Homiller, PLLC (57) ABSTRACT

A carrier having one or more conductive terminals is provided. A semiconductor die is mounted on the carrier. The semiconductor die is electrically connected to the one or more conductive terminals. The semiconductor die is encapsulated with an electrically insulating mold compound. A verification rule that tests whether inputted information satisfies authentication criteria is created. A first identification feature is formed on a metal structure that is encapsulated by the mold compound. The first identification feature comprises one or more symbols from a first data representation scheme that are covered by the mold compound. The one or more symbols of the first identification feature are selected to convey information that satisfies the authentication criteria of the verification rule.

20 Claims, 7 Drawing Sheets

(56) References Cited

U.S. PATENT DOCUMENTS

| | | | | |
|---|---|---|---|---|
| 6,744,144 B2* | 6/2004 | Peterson | ............... | H01L 23/544 257/797 |
| 7,252,239 B2* | 8/2007 | Braun | ................. | B42D 25/435 235/488 |
| 7,343,214 B2* | 3/2008 | Koh | ..................... | G06Q 10/08 700/115 |
| 7,684,608 B2* | 3/2010 | Chen | ................. | G01R 31/2893 382/141 |
| 9,099,481 B2* | 8/2015 | Šik | ..................... | H01L 29/2003 |
| 9,646,373 B2* | 5/2017 | Tziazas | ................. | G06T 7/001 |
| 9,759,757 B2* | 9/2017 | House | .................. | G01R 29/26 |
| 9,897,560 B2* | 2/2018 | Martin | ................. | H01L 23/544 |
| 10,060,973 B1* | 8/2018 | Helinski | ........... | G01R 31/2884 |
| 10,102,426 B2* | 10/2018 | Kito | ......................... | G01J 1/44 |
| 10,229,886 B2* | 3/2019 | Yu | ............................ | H01L 22/12 |
| 10,559,542 B2* | 2/2020 | Cheng | ............... | H01L 21/7684 |
| 10,586,318 B2* | 3/2020 | Stone | ................ | G01N 21/956 |
| 10,607,049 B2* | 3/2020 | Grot | ................. | H05K 3/3452 |
| 2002/0076897 A1* | 6/2002 | Peterson | ............... | H01L 23/544 438/401 |
| 2005/0224791 A1* | 10/2005 | Boyd | .................. | H05K 1/0269 257/48 |
| 2006/0187719 A1* | 8/2006 | Matsumoto | .......... | H01L 23/544 365/189.07 |
| 2007/0241466 A1* | 10/2007 | Chou | .................. | H01L 23/544 257/797 |
| 2010/0314750 A1* | 12/2010 | Bhate | ................ | B23K 26/355 257/730 |
| 2012/0226463 A1* | 9/2012 | Keller, III | ............... | G06F 21/73 702/117 |
| 2015/0078518 A1* | 3/2015 | Tziazas | ................ | G01N 21/84 378/53 |
| 2015/0262347 A1* | 9/2015 | Duerksen | ................ | G07D 7/20 382/182 |
| 2016/0043043 A1* | 2/2016 | Karpman | ................ | G01L 1/18 |
| 2016/0141187 A1* | 5/2016 | Marbella | ............... | H01L 21/566 257/796 |
| 2016/0169818 A1* | 6/2016 | Martin | ................. | H01L 23/544 702/81 |
| 2018/0068955 A1* | 3/2018 | De Langen | ............ | G06F 21/44 |
| 2019/0035746 A1* | 1/2019 | Lai | ....................... | H01L 23/544 |
| 2019/0189171 A1* | 6/2019 | Yang | ................. | H04L 63/0876 |
| 2019/0251349 A1* | 8/2019 | Duerksen | ................ | G06T 7/0002 |
| 2019/0311881 A1* | 10/2019 | Lavely | ................. | H01J 37/244 |

\* cited by examiner

SEMICONDUCTOR PACKAGE AUTHENTICATION FEATURE

BACKGROUND

One problem faced by semiconductor device manufacturers is the issue of counterfeiting. Semiconductor device manufacturers typically provide visible identifying information on the outside of a packaged semiconductor device. For example, a label may be provided on the encapsulation material of a packaged semiconductor device. This label may include identifying information about the semiconductor device or devices incorporated therein, such as a model or part number. One form of counterfeiting involves replacing or altering this label to represent incorrect identifying information. For example, a counterfeiter may alter a packaged device to represent a product with high commercial value when the underlying device is in fact relatively old and/or inexpensive or is not functional at all.

To date, there are no easy solutions that allow a possessor of a packaged semiconductor device to verify the authenticity of the identifying information provided on the outside of a packaged device. In many cases, a semiconductor die does not come equipped with electrical functionality to verify authenticity. Moreover, once a device is mounted on a printed circuit board, obtaining a readout of identifying information of the devices can be difficult to obtain.

SUMMARY

A method of producing a semiconductor device is disclosed. According to an embodiment of the method, a carrier comprising one or more conductive terminals is provided. A semiconductor die is mounted on the carrier. The semiconductor die is electrically connected to the one or more conductive terminals. The semiconductor die is encapsulated with an electrically insulating mold compound. A verification rule that tests whether inputted information satisfies authentication criteria is created. A first identification feature is formed on a metal structure that is encapsulated by the mold compound. The first identification feature comprises one or more symbols from a first data representation scheme that are covered by the mold compound. The one or more symbols of the first identification feature are selected to convey information that satisfies the authentication criteria of the verification rule.

A semiconductor device is disclosed. According to an embodiment, the semiconductor device comprises a carrier comprising one or more conductive terminals, a semiconductor die mounted on the carrier and electrically connected to the one or more conductive terminals, an electrically insulating mold compound encapsulating the mounted semiconductor die, and a first identification feature on a metal structure that is encapsulated by the mold compound. The first identification feature comprises one or more symbols from a first data representation scheme that are covered by the mold compound. The one or more symbols of the first identification feature convey information that satisfies the authentication criteria of a predefined verification rule created by the producer of the semiconductor device.

A method of verifying authenticity of a packaged semiconductor device is disclosed. According to an embodiment, the method includes providing a packaged semiconductor device comprising a carrier comprising one or more conductive terminals, a semiconductor die mounted on the carrier and electrically connected to the one or more conductive terminals, and a first identification feature having one or more symbols from a first data representation scheme that are covered by the mold compound. The method further includes obtaining information from the first identification feature through non-destructive examination of the packaged semiconductor device. The method further includes verifying authenticity of the packaged semiconductor device by applying a verification rule to the obtained information.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 4, which includes

FIG. 5, which includes

FIG. 6, which includes

DETAILED DESCRIPTION

According to embodiments described herein, a packaged semiconductor device is provided with an identification feature that can be used to verify authenticity of the device. The identification feature is provided on a structure, e.g., a metal structure, that is encapsulated, e.g., by mold compound. The identification feature includes symbols from a data representation scheme (e.g., alphanumeric, bar code, etc.). These symbols are provided on a surface of the metal structure that is covered by the encapsulation material. Hence, the information conveyed by the symbols of the identification feature is not obtainable through visual inspection of the outside of the device. That is, the information displayed by the identification feature is embedded within the encapsulation material. However, an outline of the symbols of the identification feature can be easily ascertained through a non-invasive examination technique, such as radiographic examination (e.g., X-Ray) of the packaged semiconductor device.

According to embodiments described herein, the producer of the packaged semiconductor device creates a verification rule for determining authenticity of the device. Once this rule is created, the producer configures the embedded identification feature to convey information that satisfies authentication criteria of the verification rule. In turn, the possessor of the packaged semiconductor device can verify authenticity of the device by applying information derived from the first identification feature to the verification rule. Specifically, the possessor of the packaged semiconductor device can test information derived from the first identification feature against a manufacturer defined criteria of an authentic product. In addition, or in the alternative, the possessor of the packaged semiconductor device can use information derived from the first identification feature to determine a specific information about the semiconductor die, e.g., model number, manufacturer, etc., and compare this specific information against a corresponding seller representation, e.g., from a label provided on the outside of the device. This advantageously allows the possessor of the device to determine the identify and/or authenticity of the packaged semiconductor device, i.e., whether identifying information about the device accurately corresponds to the original product, in a cost-effective and non-destructive manner.

Figures 1A, 1B:
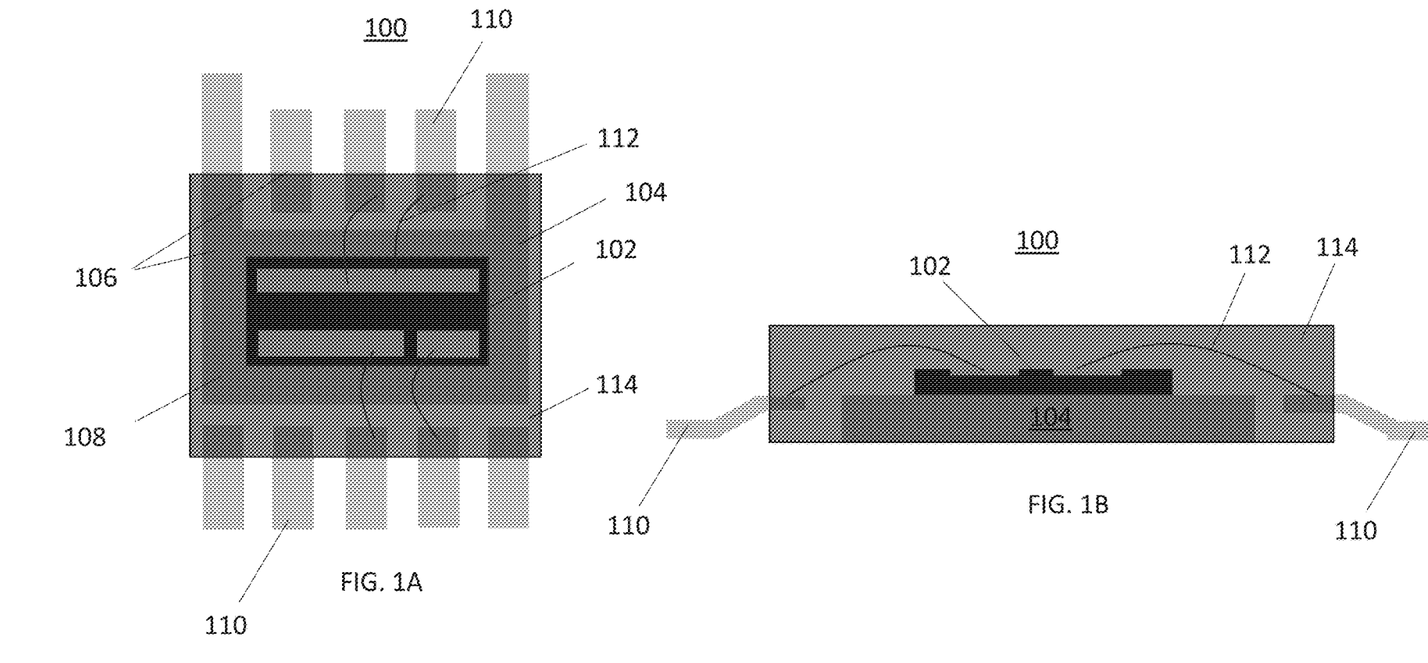
FIGS. 1A and 1B, depicts a packaged semiconductor device, according to an embodiment.

Referring to FIG. 1, a packaged semiconductor device 100 is depicted, according to an embodiment. FIG. 1A is a plan-view perspective of the packaged semiconductor device 100 and FIG. 1B is a cross-sectional perspective of the packaged semiconductor device 100. The packaged semiconductor device 100 includes a semiconductor die 102. Generally speaking, the semiconductor die 102 can include any of a wide variety of semiconductor materials, e.g., silicon, silicon germanium, silicon carbide, gallium nitride, etc. The semiconductor die 102 can have a wide variety of device configurations, including discrete device configurations, e.g., power MOSFET (Metal Oxide Semiconductor Field Effect Transistors), HEMT (High Electron Mobility Transistor), etc., as well as integrated device configurations, e.g., controllers, sensors, memory devices, processors, etc., to name a few.

The semiconductor die 102 is mounted on a carrier 104. In the embodiment of FIG. 1, the carrier 104 is provided by an electrically conductive lead frame 106. The lead frame 106 includes a central die pad 108 and a number of electrically conductive leads 106 extending away from the die pad 108. The leads 106 provide terminals for the carrier 104 that are electrically connected to terminals (i.e., bond pads) of the semiconductor die 102 by bond wires 112. The semiconductor die 102 is mounted on a planar die attach surface of the die pad 108 using, e.g., an adhesive, such as a solder, sinter or glue.

The semiconductor die 102 is encapsulated by an electrically insulating mold compound 114. In the figure, the mold compound 114 is schematically represented as translucent so that the interior features of the packaged semiconductor device 100 are visible. In practice, the mold compound 114 is typically opaque. The mold compound 114 covers the semiconductor die 102 thereby protecting the semiconductor die 102 and associated electrical connections between the bond pads and bond wires 112 from the exterior environment. The mold compound 114 includes an electrically insulating material, e.g., ceramic, plastic, etc. This material can be formed, e.g., by an injection or transfer molding process, after the semiconductor die 102 is mounted and electrically connected to the carrier 104.

Figure 2:
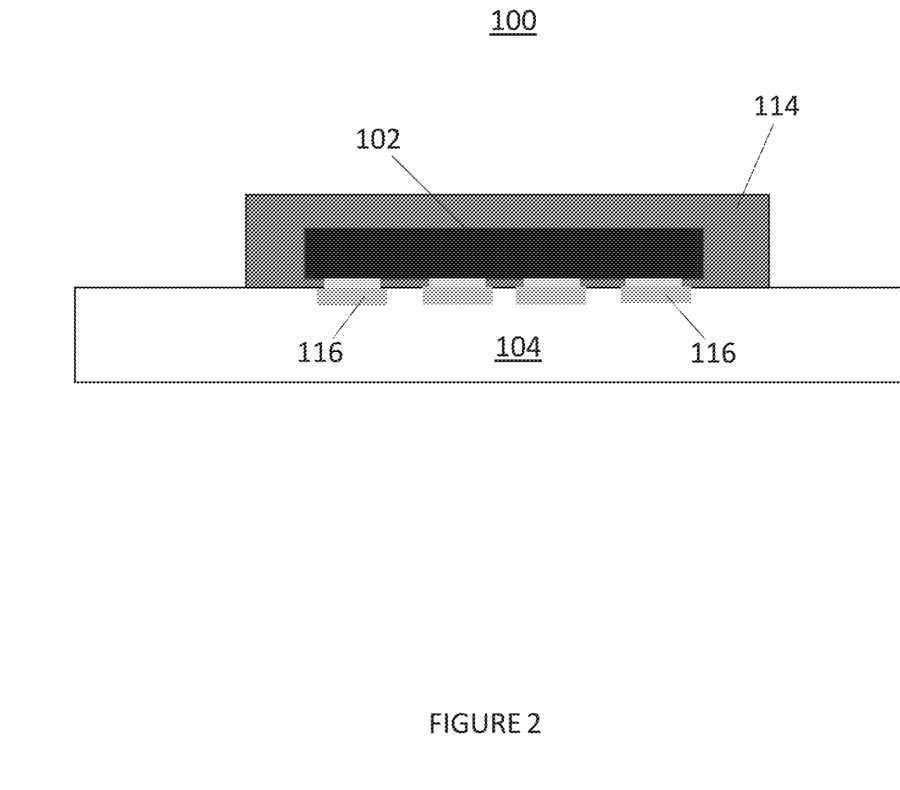
FIG. 2 depicts a packaged semiconductor device, according to another embodiment.

Referring to FIG. 2, a packaged semiconductor device 100 is depicted, according to another embodiment. The packaged semiconductor device 100 of FIG. 2 is configured as a so-called leadless package, wherein the device is mounted directly onto the surface of a global interconnection structure, such as a printed circuit board. In this embodiment, the carrier includes an insulating portion and conductive terminals 116. The conductive terminals 116 may be used to provide an electrical connection to other devices (now shown) accommodated by the carrier 104 via conductive tracks in the carrier 104. In this example, the semiconductor die 102 may be mounted in a receptacle, such as a socket, which includes the conductive terminals 116 and electrically connected to these conductive terminals 116 according to a variety of known techniques, e.g., solder ball, wire bond, etc. After forming these electrical connections, the mold compound 114 is formed around the semiconductor die 102 to encapsulate the semiconductor die 102 directly on the carrier 104.

The package configurations described with reference to FIGS. 1-2 represent two examples of a wide variety of potential package configurations. The person having ordinary skill will appreciate that semiconductor packages can vary substantial in many aspects, such as lead configuration (e.g., DIP (dual in-line package), BGA (ball grid array), PGA (pin grid array), QFN (quad flat no-leads), leadless, etc.), connector configuration (e.g., bond wire, clip, ribbon, flip-chip, etc.), carrier configuration (e.g., lead frame, PCB, etc.), encapsulant configuration, (e.g., overmold, open air cavity, etc.). Semiconductor packages can be configured as so-called surface mount packages wherein the leads are configured to be planar with the surface of a PCB when the package is mounted and so-called through hole configurations wherein the leads are configured to be inserted into a through hole. The authentication concepts described herein including the techniques for forming and using the first and second identification features to be described in further detail below, are compatible with any one of the above described package configurations.

Figure 3:
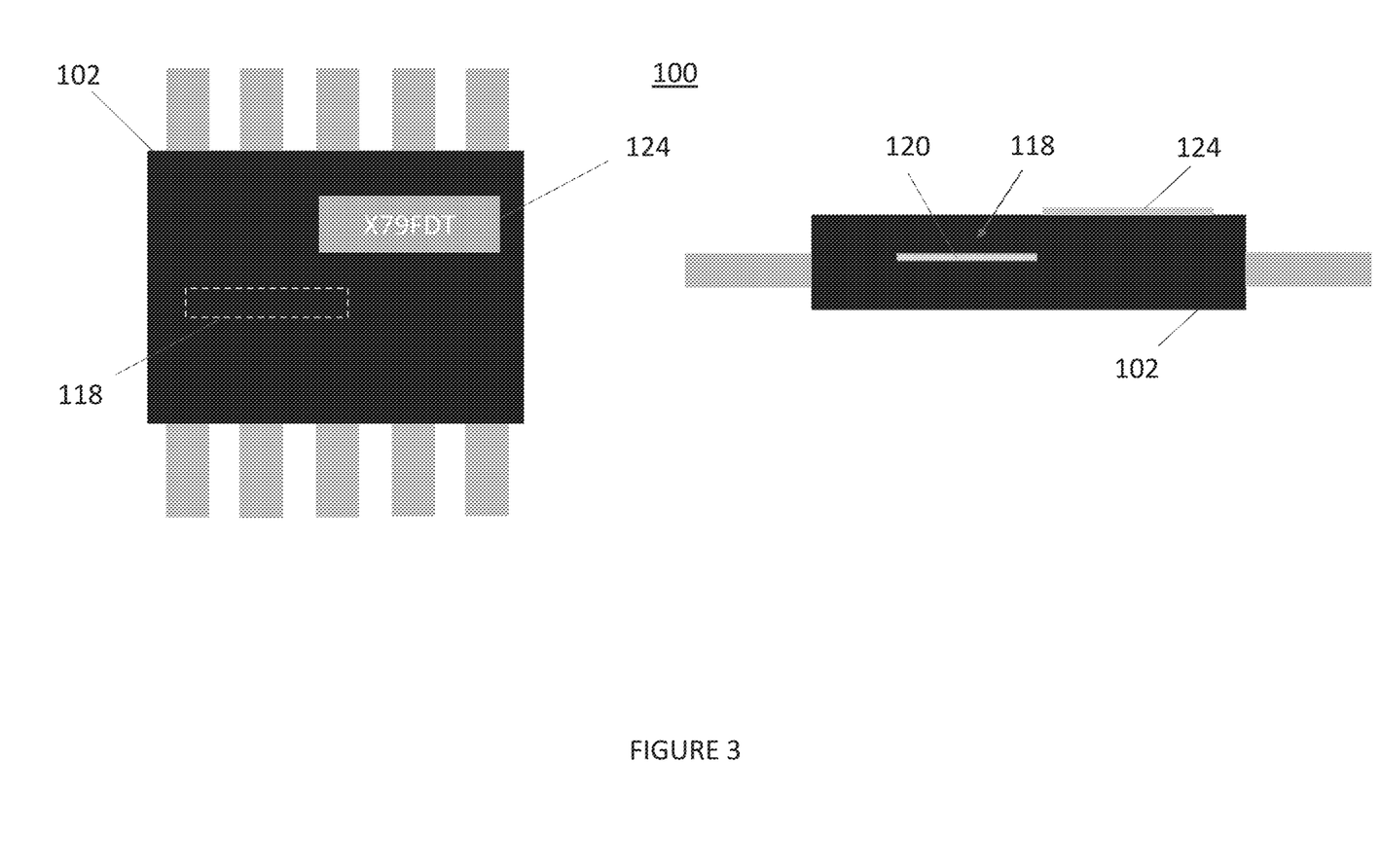
FIG. 3 depicts a packaged semiconductor device having first and second identification features, according to an embodiment.
Figure 4A:
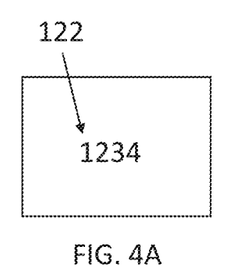
FIGS. 4A-4F, depicts data representation schemes for the first and second identification features, according to various embodiments.
Figure 4B:
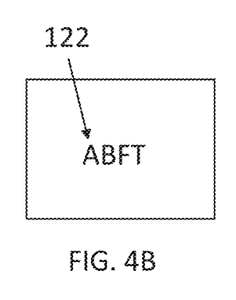
Figure 4C:
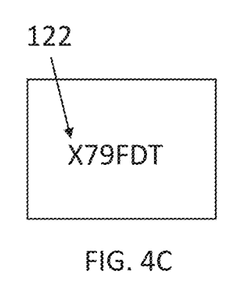
Figure 4D:
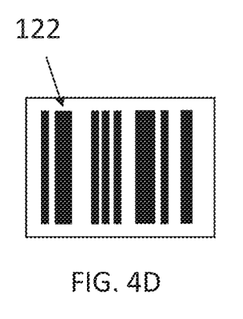
Figure 4E:
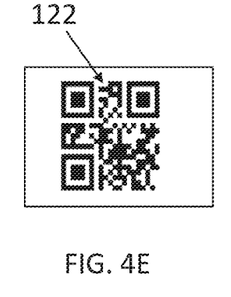
Figure 4F:
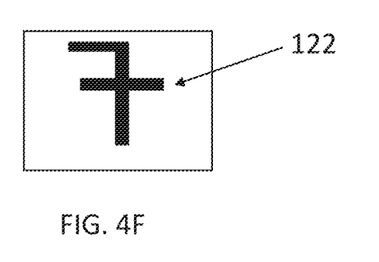

Referring to FIG. 3, a packaged semiconductor device 100 is configured to include a first identification feature 118. The first identification feature 118 is provided on an embedded structure 120 that is at least partially surrounded by the mold compound 114. For example, the embedded structure 120 can be part of the carrier 104, such as the die pad 108 and encapsulated portions of the leads 106, in the case of a lead-frame configured package. Alternatively, the embedded structure 120 can be an integral feature of the semiconductor die 102, e.g., a metallization layer. In yet another embodiment, the embedded structure 120 is a dedicated structure that is separate from the carrier 104 or die 102.

Referring to FIG. 4, various data representation schemes are shown. A data representation scheme refers to a finite set of predefined symbols 122 that individually or in combination with one another convey information by virtue of their appearance. FIG. 4A illustrates a numeric data representation scheme wherein the predefined symbols 122 are exclusively integer numbers. FIG. 4B illustrates an alphabetic data representation wherein the predefined symbols 122 are exclusively letters. FIG. 4C illustrates an alphanumeric data representation wherein the predefined symbols 122 include both integer numbers and letters. FIG. 4D illustrates a one-dimensional bar code data representation scheme wherein the predefined symbols 122 are stripe-shaped bars. FIG. 4E illustrates two-dimensional bar code data representation scheme (e.g., a so-called "QR Code") wherein the predefined symbols 122 are rectangles and are combined with one another in a two-dimensional grid. FIG. 4F illustrates a user-defined data representation scheme wherein the predefined symbols 122 are not part of any standardized system, and whose meaning is derived from user-defined interpretations.

Referring again to FIG. 3, the first identification feature 118 is configured to convey information using the symbols 122 from a first data representation scheme. The first data representation scheme may be any one of the data representation schemes described with reference to FIG. 4. More generally, the first data representation scheme may be any data representation scheme with predefined symbols 122 whose meaning can be ascertained through visual inspection. In any case, the symbols 122 provided on the first identification feature 118 are covered by the mold compound 114. Thus, in the case of an opaque mold compound 114, the information conveyed by the first identification feature 118 is concealed.

The first identification feature 118 can be configured to convey information that satisfies authentication criteria of a verification rule. The verification rule is a procedure adopted by the producer of the packaged semiconductor device 100, which may be the same party that manufactures the semiconductor die 102 or may be a party that assembles the semiconductor die 102 on the carrier 104. In an embodiment, the verification rule tests whether inputted information satisfies authentication criteria. The authentication criteria are satisfied if the inputted information correctly corresponds to authentic identifying information about the semiconductor device 100. Conversely, the authentication criteria are not satisfied if the inputted information misrepresent the identifying information of the packaged semiconductor device 100.

Once the verification rule is defined by the producer of the packaged semiconductor device 100, the producer selects symbols 122 for the first identification feature 118 to convey information that satisfies the authentication criteria. That is, the producer of the packaged semiconductor device 100 configures the first identification feature 118 to provide at least some of the inputted information necessary to satisfy the authentication criteria of the verification rule.

According to an embodiment, the authentication criteria comprises performing an authentication rule on a string of alphanumeric characters. In one example of this concept, the authentication rule can stipulate that each successive character in a string is different from the previous character by the same number of places of the chosen data representation scheme. Thus, the string 'ACED' satisfies the criterion that each successive character differs from the previous one by two places in the English alphabet, whereas the string of 'ABES' does not satisfy this criterion. More complex authentication criteria are certainly possible, and the producer may incorporate a variety of known cryptography techniques to enhance security and/or conceal the information to which the authentication rule is performed on. Once authentication criteria are determined, the producer can select symbols 122 of the first identification feature 118 to convey information that satisfies the authentication rule. Hence, the first identification feature 118 can be used in conjunction with the verification rule to independently certify the authenticity of the device. One advantage of this technique is that no additional information is needed to verify authenticity of the device. That is, the authentication criteria can be satisfied exclusively from information derived from the first identification feature 118. Alternatively, the verification rule can include a combination of the above described authentication rule and other authentication criteria so as to provide multiple layers of authentication.

According to an embodiment, the authentication criteria comprises comparing information derived from the symbols 122 of the first identification feature 118 to identifying information that identifies a specific characteristic semiconductor device. In contrast to the authentication criteria described in the immediately preceding paragraph, this authentication criteria utilizes two sources of information, namely, information from the first identification feature 118 and the identifying information. The identifying information can come from a variety of sources, such as a label or plate on the outside of the packaged semiconductor device 100, or a representation from the seller of the packaged semiconductor device 100. This identifying information can describe a specific characteristic of the packaged semiconductor device 100, e.g., model number, part number, etc., or a broader classification, device type, manufacturer, power rating, etc.

In one example of this concept, the producer of the device 100 configures the first identification feature 118 to include an arbitrarily defined symbol 122, e.g., using the data representation scheme of FIG. 3F. This symbol 122 is then directly compared to a symbol 122 provided by a seller of the device, e.g., on a label on the outside of the package. If the two symbols 122 match, the authentication criteria are satisfied, and the device is confirmed as authentic. If the two symbols 122 do not match, the authentication criteria are not satisfied, and the device is inauthentic.

In another example of this concept, the verification rule compares a code derived from the symbols 122 of the first identification feature 118 to an authorized code. This authorized code is cross-referenced to the semiconductor die 102, meaning that it represents a certain characteristic of the semiconductor die 102. For example, the authorized code can be a serial number, part number, etc., of the semiconductor die 102, which is typically provided outside of most devices. The producer of the device 100 can configure the first identification feature 118 to convey the authorized code so that a possessor of the semiconductor device can determine the veracity of a purported authorized code provided by another source.

According to an embodiment, the packaged semiconductor device includes a second identification feature 124. The second identification feature 124 includes one or more symbols 122 from a second data representation scheme. The second data representation scheme may be any one of the data representation schemes described herein, including those specifically described with reference to FIG. 4. Thus, information can be conveyed by and derived from the second identification feature 124 in a similar manner as previously described. The second data representation scheme may be the same or different from the first data representation scheme employed by the first identification feature 118.

The second identification feature 124 is provided on a surface of the mold compound 114 that is spaced apart from the first identification feature 118. That is, mold compound 114 is provided between the embedded structure 120 and the second identification feature 124. In an embodiment, the second identification feature 124 is provided such that the symbols 122 of the second identification feature 124 are visibly perceptible from outside the device 100. For example, the symbols 122 of the second identification feature 124 can be provided on a label or plate which is attached to the outer surface of the mold compound 114. In another example, the symbols 122 of the second identification feature 124 can be features that are etched directly into the outer surface of the mold compound 114. In another embodiment, the second identification feature 124 is configured such that the symbols 122 of the second identification feature 124 are not visibly perceptible. For example, the symbols 122 of the second identification feature 124 can be etched into an intermediate surface of the mold compound 114 which is subsequently covered by a further molding process during manufacture of the device.

The second identification feature 124 can be configured in connection with the verification rule to verify authenticity of the packaged semiconductor device 100. In one example of this concept, the second identification feature 124 can be configured to convey the identifying information that specifically identifies a characteristic semiconductor device. More specifically, the second identification feature 124 can be configured to convey the authorized code as described above using the symbols 122 of the second data representation scheme. In another example of this concept, the second identification feature 124 can be configured to convey part of an authentication rule, e.g., a rule that is performed on a string of alphanumeric characters as described above. For example, the second identification feature 124 could include a number '3' at a predetermined location in a string of characters, wherein the number '3' corresponds to the relative place difference between successive symbols 122 on the first identification feature 118 for an authentic device. More generally, the second identification feature 124 can convey any information that is used in combination with information derived from the first identification feature 118 to perform the verification rule. Alternatively, the second identification feature 124 can be configured as an independent mechanism for verifying authenticity of the device by creating a second verification rule according to the concepts described herein.

A method for verifying the authenticity of the packaged semiconductor device 100 will now be described. According to an embodiment of this method, a packaged semiconductor device 100 according to any of the embodiments described herein is provided. Information is obtained from the first identification feature 118 by a first non-destructive examination technique. As used herein, a non-destructive examination technique refers to a technique that does not involve alteration of the mold compound 114 or separation of the mold compound 114 from the carrier 104 such that the semiconductor die 102 remains intact within the encapsulation material during examination. Examples of these non-destructive examination techniques include radiographic imaging techniques, e.g., X-Ray, MRI, etc., and sonographic imaging techniques, e.g., ultrasound. After obtaining information from the first identification feature 118, authenticity of the packaged semiconductor device 100 is verified by applying a verification rule to the obtained information, e.g., according to any of the techniques described herein.

In an embodiment, the packaged semiconductor device 100 includes the second identification feature 124 as described above, and the method further includes obtaining information from the second identification feature 124 through a second non-destructive examination of the packaged semiconductor device 100. In an embodiment, the second non-destructive examination technique is different from the first non-destructive examination technique. For example, information may be obtained from the second identification feature 124 by visual inspection, e.g., using cameras or observing with the naked eye, or by a sonographic examination technique, whereas information may be obtained from the first identification feature 118 by a radiographic technique, such as an X-Ray. After obtaining information from both identification features 118, 124, the authenticity of the packaged semiconductor device 100 can be verified using the obtained information, e.g., according to any of the techniques described herein.

Figure 6A:
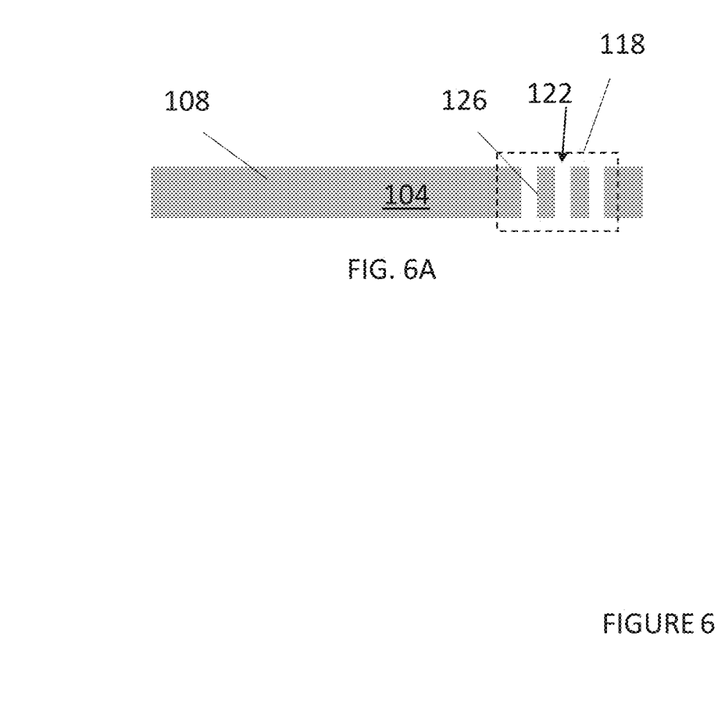
FIGS. 6A and 6B, depicts an identification feature formed in the lead frame of a packaged semiconductor device, according to an embodiment.
Figure 6B:
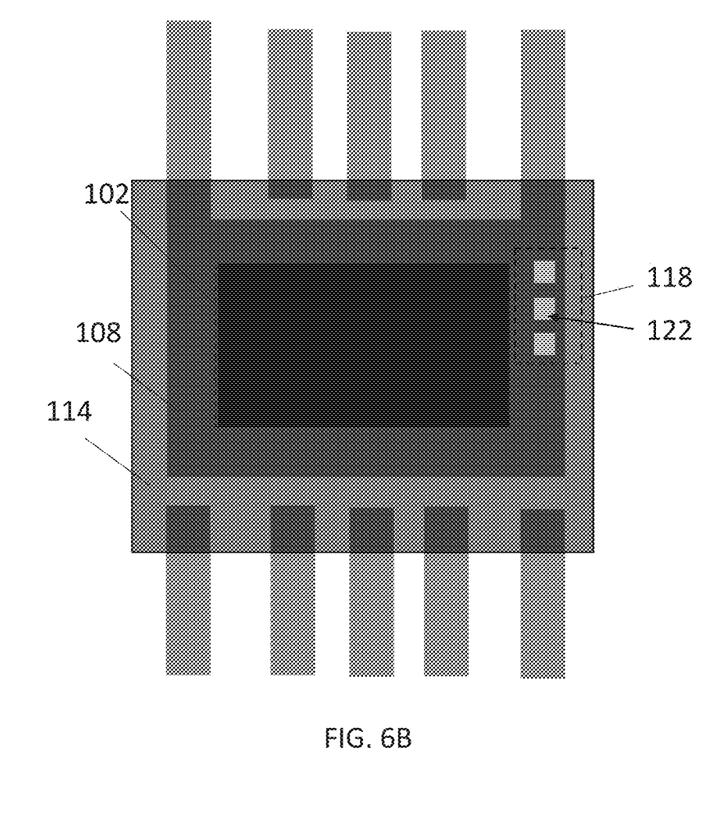
Figure 7:
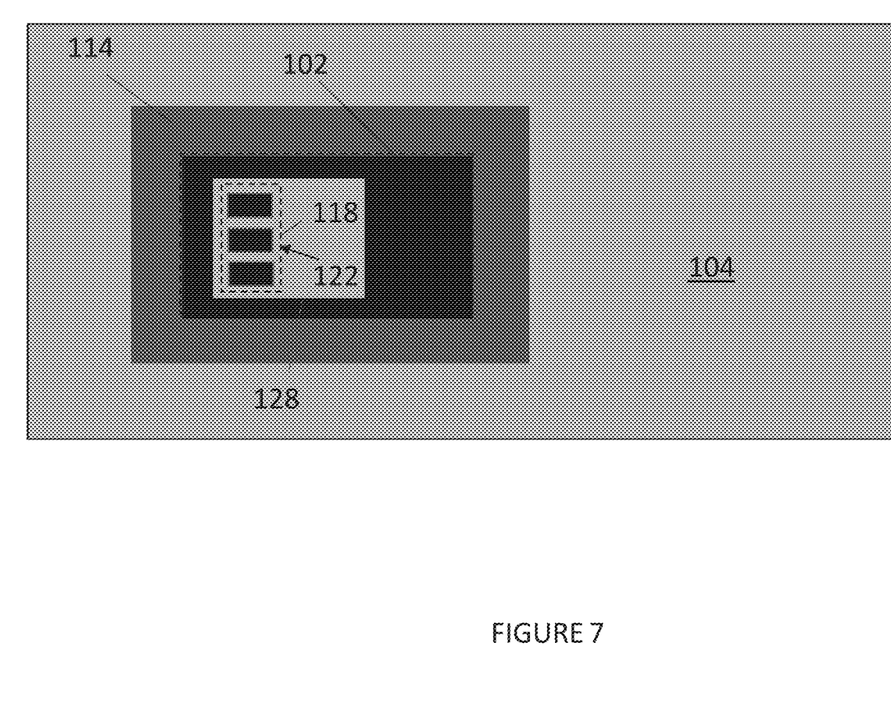
FIG. 7 depicts an identification feature formed in a metallization layer of a packaged semiconductor device, according to an embodiment.

Referring to FIGS. 5-7, exemplary structural configurations for the first identification feature 118 are disclosed. In each case, the first identification feature 118 is formed on a planar metal surface of the packaged device that is covered by the mold compound 114. As used herein, a metal surface is covered by mold compound 114 if the mold compound 114 extends over the metal surface. This includes configurations wherein the metal surface directly contacts the mold compound 114 and configurations wherein one or more intermediate materials are provided between the metal surface and the mold compound 114. Additionally, as used herein, a metal surface is planar if generally extends along a single plane. These metal surfaces include the surfaces of a lead frame, e.g., die pads, leads, etc. These metal surface additionally include metallization layers that are integrated into semiconductor dies. These metallization layers may have a profile that deviates from exactly planar, e.g., due to the formation of via structures, and are nonetheless planar metal surfaces for the purposes of the present disclosure.

According to an embodiment, the symbols 122 of the first identification feature 118 are formed by disruptions in the planar metal surface. These disruptions are intentionally formed features that alter the otherwise planar nature of the metal surface. That is, the disruptions include angled intersections with the planar metal surface. Outer edges 126 of the disruptions form the one or more symbols 122 of the first data representation scheme. In the figures, the outer edges 126 of the disruptions form squares. In practice, the disruptions in the planar metal surface can be configured to provide symbols 122 of any of the data representation schemes described herein, e.g., an alphabetical system, a numeral system, an alphanumeric system, bar code system, etc. More generally, the disruptions in the planar metal surface be configured to provide any symbol whose outline conveys a quantity (e.g., two bits, three bits, etc.) of information.

Figure 5A:
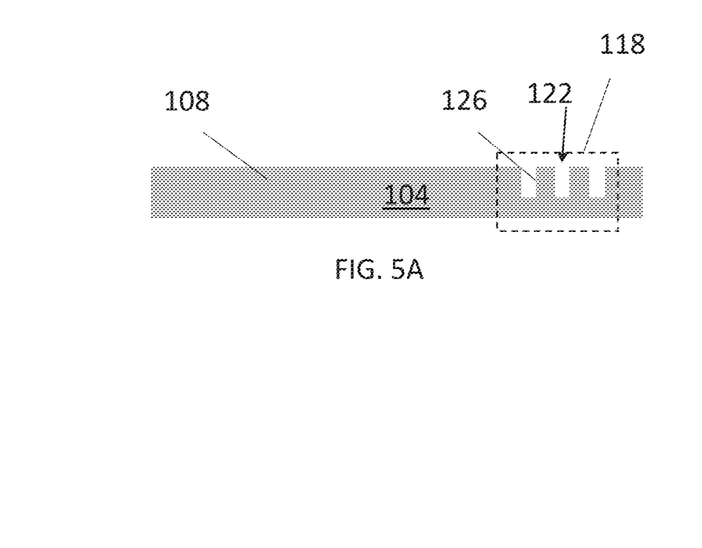
FIGS. 5A and 5B, depicts an identification feature formed in the lead frame of a packaged semiconductor device, according to an embodiment.
Figure 5B:
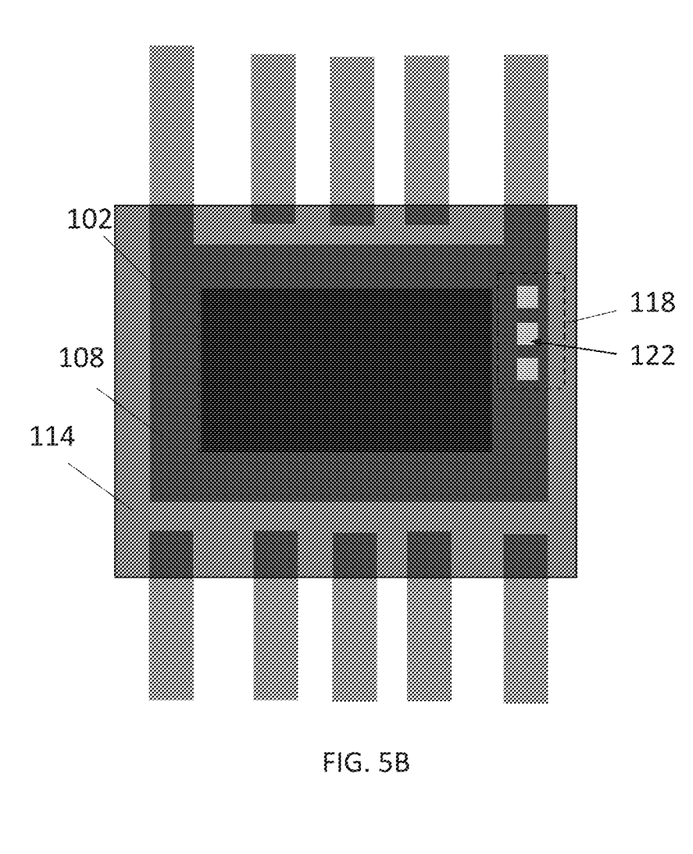

Referring to FIG. 5, a lead-frame style package, e.g., as described with reference to FIG. 1, is shown. FIG. 5A depicts a cross-sectional view of the lead frame 106 without the die and mold compound 114 and FIG. 5B depicts an X-Ray image of the packaged device after encapsulation. In this embodiment, the first identification feature 118 is formed on a surface region of the lead frame 106 that is laterally spaced apart from the semiconductor die 102. More particularly, the first identification feature 118 is provided on a portion of the die pad 108 outside of the mounting area.

In the embodiment of FIG. 5, the first identification feature 118 is formed by partial etching the lead frame 106. Partial etching refers to a technique whereby the etching is controlled, e.g., through appropriate use of mask, time, etchant chemical, etc., to prevent the etchant from completely penetrating the material. In one example of this technique, the lead frame 106 is formed from a planar sheet of metal by providing a mask on both sides of the sheet metal and subsequently etching away the exposed portions of the mask. The mask is patterned as a mirror image on both sides, except that the geometry of partially etched features is exposed on one side and covered on another. As a result of the partial etching, the lead frame 106 includes recessed portions. The outer sidewalls of these recessed portions define the symbols 122 for the first identification feature 118.

Referring to FIG. 6, a lead-frame style package, e.g., as described with reference to FIG. 1 is shown, according to another embodiment. FIG. 6A depicts a cross-sectional of the lead frame 106 without the die and mold compound 114 and FIG. 6B depicts an X-Ray image of the packaged device after encapsulation. The embodiment of FIG. 6 is substantially identical to the embodiment of FIG. 5 with the exception that the first identification feature 118 is formed by fully etching the lead frame 106. Thus, in contrast to the above described technique, the etching process forms complete perforations, i.e., openings, in the lead frame 106. The sidewalls of these openings define the symbols 122 for the first identification feature 118.

Referring to FIG. 7, a chip-carrier style device that is molded directly on a circuit board, e.g., as described with reference to FIG. 2 is shown, according to an embodiment. FIG. 7 depicts an X-Ray image of the packaged device after encapsulation. According to an embodiment, the first identification feature 118 is formed in a planar metal surface that s an integral component of the semiconductor die 102. That is, the first identification feature 118 is directly incorporated into the structure of the semiconductor die 102. In the depicted embodiment, the first identification feature 118 is formed in a metallization layer 128 of the semiconductor die 102 that is part of a so-called back end of the line portion of the die 102. The back end of the line portions typically include one or more thin layers of metal, i.e., metallization layers, that provide electrical connectivity to the semiconductor devices incorporated therein. The first identification feature 118 may be formed in a power metallization layer 128 of the semiconductor die 102, which may be a very thick layer of metallization provided at or near the top of the back end of the line portion and is configured to provide a power connection (e.g., source/drain, etc.) to the devices incorporated therein. In another embodiment, a dedicated metallization layer 128 is provided in the semiconductor die 102 solely for the purpose providing the first identification feature 118. The symbols 122 of the first identification feature 118 may be provided by perforations, i.e., openings, in the metal surface of the semiconductor die 102, wherein the outer edges 126 of these openings define the symbols 122.

According to an embodiment, the symbols 122 formed in the metallization layer 128 are formed by a laser scribing technique. Generally speaking, laser scribing refers to a technique of directing a high energy light beam into a concentrated location so as to modify and, in some cases, completely dissolve the subject material. One advantage of a laser scribing technique in comparison to techniques wherein the first identification feature 118 is formed from a mask, e.g., as described with reference to FIGS. 5 and 6, is that laser scribing does not require the provision of a new mask for each unique symbol to be formed. Hence, a laser scribing technique can be cost-effective in comparison to a masked etching technique in some circumstances, as a unique identifier can be provided on a group of otherwise identical semiconductor dies 102 without the additional expense of a mask for each die.

In an embodiment that can be combined with others, a method of producing a semiconductor device includes providing a carrier comprising one or more conductive terminals, mounting a semiconductor die on the carrier, electrically connecting the semiconductor die to the one or more conductive terminals, encapsulating the mounted semiconductor die with an electrically insulating mold compound, creating a verification rule that tests whether inputted information satisfies authentication criteria, and forming a first identification feature on a metal structure that is encapsulated by the mold compound. The first identification feature comprises one or more symbols from a first data representation scheme that are covered by the mold compound. The one or more symbols of the first identification feature are selected to convey information that satisfies the authentication criteria of the verification rule.

In an embodiment that can be combined with others, the authentication criteria comprises comparing information derived from the one or more symbols to identifying information that identifies a specific characteristic semiconductor device, and the one or more symbols are selected to produce information that in combination with the identifying information satisfies the authentication criteria.

In an embodiment that can be combined with others, the verification rule compares a code derived from the one or more symbols to an authorized code that is cross-referenced to the semiconductor die, and the one or more symbols are selected to convey information that produces the authorized code through application of the verification rule.

In an embodiment that can be combined with others, the method further comprises providing a second identification feature on a surface of the mold compound that is spaced apart from the first identification feature, wherein the second identification feature comprises one or more symbols from a second data representation scheme, and wherein the one or more symbols of the second identification feature are selected to convey the authorized code.

In an embodiment that can be combined with others, the metal structure comprises a planar metal surface, and the method further comprises forming the first identification feature by forming disruptions in the planar metal surface, and outer edges of the disruptions form the one or more symbols of the first data representation scheme.

In an embodiment that can be combined with others, the first data representation scheme is any one of: an alphabetical system, a numeral system, an alphanumeric system, or a bar code system.

In an embodiment that can be combined with others, the carrier is an electrically conductive lead frame comprising a die pad and one or more electrically conductive leads, and the planar metal surface is a surface region of the lead frame that is laterally spaced apart from the semiconductor die.

In an embodiment that can be combined with others, forming the first identification feature comprises partial etching the lead frame to form recessed portions in the lead frame that define the one or more symbols of the first data representation scheme.

In an embodiment that can be combined with others, forming the first identification feature comprises fully etching the lead frame to form perforations in the lead frame that define the one or more symbols.

In an embodiment that can be combined with others, the planar metal surface is an integral component of the semiconductor die.

In an embodiment that can be combined with others, the planar metal surface is a power metallization layer of the semiconductor die, and wherein forming the first identification feature comprises laser scribing the power metallization layer to form perforations in the power metallization layer that define the one or more symbols.

In an embodiment that can be combined with others, a semiconductor device comprises a carrier comprising one or more conductive terminals, a semiconductor die mounted on the carrier and electrically connected to the one or more conductive terminals, an electrically insulating mold compound encapsulating the mounted semiconductor die, and a first identification feature on a metal structure that is encapsulated by the mold compound. The first identification feature comprises one or more symbols from a first data representation scheme that are covered by the mold compound. The one or more symbols of the first identification feature convey information that satisfies the authentication criteria of a predefined verification rule created by the producer of the semiconductor device.

In an embodiment that can be combined with others, the metal structure comprises a planar metal surface, the planar metal surface comprises disruptions, and outer edges of the disruptions form the one or more symbols of the first data representation scheme.

In an embodiment that can be combined with others, the first data representation scheme is any one of: an alphabetical system, a numeral system, an alphanumeric system, or a bar code system.

In an embodiment that can be combined with others, the carrier is an electrically conductive lead frame comprising a die pad and one or more electrically conductive leads, and the planar metal surface is a surface region of the lead frame that is laterally spaced apart from the semiconductor die.

In an embodiment that can be combined with others, the planar metal surface is an integral component of the semiconductor die.

In an embodiment that can be combined with others, the semiconductor device further includes a second identification feature on a surface of the mold compound that is spaced apart from the metal structure, the second identification feature displaying one or more symbols from a second data representation scheme. The one or more symbols of the first identification feature collectively represent a first code. The one or more symbols of the second identification feature collectively represent a second code. The first code is correlated to the second code by a verification rule.

In an embodiment that can be combined with others, a method of verifying authenticity of a packaged semiconductor device comprises providing a packaged semiconductor device comprising: a carrier comprising one or more conductive terminals, a semiconductor die mounted on the carrier and electrically connected to the one or more conductive terminals, and a first identification feature having one or more symbols from a first data representation scheme that are covered by the mold compound, obtaining information from the first identification feature through non-destructive examination of the packaged semiconductor device, and verifying authenticity of the packaged semiconductor device by applying a verification rule to the obtained information.

In an embodiment that can be combined with others, the packaged semiconductor device is provided to further comprise a second identification feature on a surface of the mold compound that is spaced apart from the metal structure, the second identification feature displaying one or more symbols from a second data representation scheme, and verifying authenticity of the packaged semiconductor device comprises using obtained information from both of the first and second identification features.

In an embodiment that can be combined with others, the method further comprises, obtaining the first code by examining the first identification feature by a first non-destructive examination technique, and obtaining the second code by examining the second identification feature by a second non-destructive examination technique, wherein the first non-destructive examination technique is different from the second non-destructive examination technique.

As used herein, the term "carrier" refers to any substrate that physically supports a semiconductor die. A carrier can include conductive material and insulative material. Examples of carriers include electrically conductive lead frames and well as printed circuit boards.

As used herein, the term "code" refers to any combination of integer numbers, letters or both (i.e., an alphanumeric combination).

As used herein, the term "conveyed" when referring to information, i.e., "information is conveyed" encompasses direct conveyance of the information as well as alteration of the information, e.g., through some form of translation, cross-referencing, encoding, decoding, etc. Specifically with respect to the symbols 122 of the data representation scheme described herein, information may be conveyed by these symbols 122 through direct, unaltered use of the information conveyed by their appearance. That is, the form of the symbols 122 themselves can be regarded as the pertinent information that is being communicated. For example, the alphabetic, numeric, and alphanumeric data representation schemes as described above can be used to convey a string of letters, numbers, or numbers and letters, respectively. Additionally, information may be conveyed by these symbols 122 through one or more steps that converts the information provided by the symbols 122 into an alternate format. For example, the bar-code schemes as described herein can be used to convey a string of numbers or letters through application of a commercially available algorithm to the pattern of rectangular symbols 122. In another example, information may be conveyed by these symbols 122 through encoding techniques such as encryption. An encryption technique generally refers to a technique wherein an encryption algorithm, i.e., a cipher, is applied to information to conceal its meaning. This information is indecipherable to the possessor of the information without the usage of a decoding algorithm, i.e., a decryption key. Using the bar-code examples described above, the process of converting the rectangles into an alphanumeric string can involve the application of a decryption key. Moreover, encryption can be used to conceal the information conveyed by visible alphanumeric characters.

As used herein, the term "derived" when referring to information, i.e., "information is derived" encompasses direct replication of the information as well as alteration of the information, e.g., through some form of translation, cross-referencing, encoding, decoding, etc., as described in the preceding paragraph.

Terms such as "same," "match," and "matches" as used herein are intended to mean identical, nearly identical or approximately so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a semiconductor device, the method comprising:
   providing a carrier comprising one or more conductive terminals;
   mounting a semiconductor die on the carrier;
   electrically connecting the semiconductor die to the one or more conductive terminals;
   encapsulating the mounted semiconductor die with an electrically insulating mold compound;
   creating a verification rule that tests whether inputted information satisfies authentication criteria; and
   forming a first identification feature on a metal structure that is encapsulated by the mold compound,
   wherein the first identification feature comprises one or more symbols from a first data representation scheme that are covered by the mold compound, and
   wherein the one or more symbols of the first identification feature are selected to convey information that satisfies the authentication criteria of the verification rule.

2. The method of claim 1, wherein the authentication criteria comprises comparing information derived from the one or more symbols to identifying information that identifies a specific characteristic of the semiconductor device, and
   wherein the one or more symbols are selected to produce information that in combination with the identifying information satisfies the authentication criteria.

3. The method of claim 2, wherein the verification rule compares a code derived from the one or more symbols to an authorized code that is cross-referenced to the semiconductor die, and wherein the one or more symbols are selected to convey information that produces the authorized code through application of the verification rule.

4. The method of claim 3, further comprising providing a second identification feature on a surface of the mold compound that is spaced apart from the first identification feature, wherein the second identification feature comprises one or more symbols from a second data representation scheme, and wherein the one or more symbols of the second identification feature are selected to convey the authorized code.

5. The method of claim 1, wherein the metal structure comprises a planar metal surface, and wherein the method further comprises forming the first identification feature by forming disruptions in the planar metal surface, and wherein outer edges of the disruptions form the one or more symbols of the first data representation scheme.

6. The method of claim 5, wherein the first data representation scheme is any one of: an alphabetical system, a numeral system, an alphanumeric system, or a bar code system.

7. The method of claim 5, wherein the carrier is an electrically conductive lead frame comprising a die pad and one or more electrically conductive leads, and wherein the planar metal surface is a surface region of the lead frame that is laterally spaced apart from the semiconductor die.

8. The method of claim 7, wherein forming the first identification feature comprises partial etching the lead frame to form recessed portions in the lead frame that define the one or more symbols of the first data representation scheme.

9. The method of claim 7, wherein forming the first identification feature comprises fully etching the lead frame to form perforations in the lead frame that define the one or more symbols.

10. The method of claim 5, wherein the planar metal surface is an integral component of the semiconductor die.

11. The method of claim 10, wherein the planar metal surface is a power metallization layer of the semiconductor die, and wherein forming the first identification feature comprises laser scribing the power metallization layer to form perforations in the power metallization layer that define the one or more symbols.

12. A semiconductor device, comprising:
    a carrier comprising one or more conductive terminals;
    a semiconductor die mounted on the carrier and electrically connected to the one or more conductive terminals;
    an electrically insulating mold compound encapsulating the mounted semiconductor die; and
    a first identification feature on a metal structure that is encapsulated by the mold compound;
    wherein the first identification feature comprises one or more symbols from a first data representation scheme that are covered by the mold compound,
    wherein the one or more symbols of the first identification feature convey information that satisfies the authentication criteria of a predefined verification rule created by the producer of the semiconductor device.

13. The semiconductor device of claim 12, wherein the metal structure comprises a planar metal surface, wherein the planar metal surface comprises disruptions, and wherein outer edges of the disruptions form the one or more symbols of the first data representation scheme.

14. The semiconductor device of claim 13, wherein the first data representation scheme is any one of: an alphabetical system, a numeral system, an alphanumeric system, or a bar code system.

15. The semiconductor device of claim 13, wherein the carrier is an electrically conductive lead frame comprising a die pad and one or more electrically conductive leads, and wherein the planar metal surface is a surface region of the lead frame that is laterally spaced apart from the semiconductor die.

16. The semiconductor device of claim 12, wherein the planar metal surface is an integral component of the semiconductor die.

17. The semiconductor device of claim 12, further comprising a second identification feature on a surface of the mold compound that is spaced apart from the metal structure, the second identification feature displaying one or more symbols from a second data representation scheme, wherein the one or more symbols of the first identification feature collectively represent a first code, wherein the one or more symbols of the second identification feature collectively represent a second code, and wherein the first code is correlated to the second code by the predefined verification rule.

18. A method of verifying authenticity of a packaged semiconductor device, the method comprising:
    providing a packaged semiconductor device comprising:
    a carrier comprising one or more conductive terminals,
    a semiconductor die mounted on the carrier and electrically connected to the one or more conductive terminals, and a first identification feature having one or more symbols from a first data representation scheme that are covered by the mold compound;
    obtaining information from the first identification feature through non-destructive examination of the packaged semiconductor device; and verifying authenticity of the packaged semiconductor device by applying a verification rule to the obtained information.

19. The method of claim 18, wherein the packaged semiconductor device is provided to further comprise a second identification feature on a surface of the mold compound that is spaced apart from the metal structure, the second identification feature displaying one or more symbols from a second data representation scheme, wherein verifying authenticity of the packaged semiconductor device comprises using obtained information from both of the first and second identification features.

20. The method of claim 19, further comprising:
obtaining the first code by examining the first identification feature by a first non-destructive examination technique; and
obtaining the second code by examining the second identification feature by a second non-destructive examination technique,
wherein the first non-destructive examination technique is different from the second non-destructive examination technique.

\* \* \* \* \*

UNITED STATES PATENT AND TRADEMARK OFFICE
CERTIFICATE OF CORRECTION

PATENT NO. : 11,063,000 B2
APPLICATION NO. : 16/260912
DATED : July 13, 2021
INVENTOR(S) : S. Dankowski et al.

Page 1 of 1

It is certified that error appears in the above-identified patent and that said Letters Patent is hereby corrected as shown below:

On the Title Page

Page 2, Column 1/Item (56) U.S. Pat. Docs. (Line 15), please change "Grot" to -- Grof --.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*